United States Patent
Hill

(10) Patent No.: US 6,940,721 B2
(45) Date of Patent: *Sep. 6, 2005

(54) THERMAL INTERFACE STRUCTURE FOR PLACEMENT BETWEEN A MICROELECTRONIC COMPONENT PACKAGE AND HEAT SINK

(76) Inventor: Richard F. Hill, 4707 Detroit Ave., Cleveland, OH (US) 44102

( * ) Notice: Subject to any disclaimer, the term of this patent is extended or adjusted under 35 U.S.C. 154(b) by 237 days.

This patent is subject to a terminal disclaimer.

(21) Appl. No.: 10/234,603

(22) Filed: Sep. 3, 2002

(65) Prior Publication Data

US 2003/0007329 A1 Jan. 9, 2003

Related U.S. Application Data

(63) Continuation-in-part of application No. 10/116,573, filed on Apr. 4, 2002, now Pat. No. 6,617,517, which is a continuation-in-part of application No. 09/513,483, filed on Feb. 25, 2000, now Pat. No. 6,372,997.

(51) Int. Cl.[7] .......................... H05K 7/20; B32B 15/20
(52) U.S. Cl. ................... 361/708; 361/709; 428/642; 428/675; 428/670; 257/718; 174/252
(58) Field of Search ........................... 428/607, 615, 428/642, 680, 675, 670; 361/704, 705, 707, 708, 709, 710, 711; 228/262.1; 174/252; 257/718

(56) References Cited

U.S. PATENT DOCUMENTS

| 5,388,755 | A | * | 2/1995 | Baxter ..................... 228/123.1 |
| 5,428,889 | A | * | 7/1995 | Mita et al. .................... 29/827 |
| 5,510,650 | A | * | 4/1996 | Erskine, Jr. ................. 257/707 |
| 5,616,424 | A | * | 4/1997 | Carey et al. ................. 428/647 |
| 6,183,886 | B1 | * | 2/2001 | Chen et al. ................. 428/647 |
| 6,372,997 | B1 | * | 4/2002 | Hill et al. ................... 174/252 |
| 6,390,353 | B1 | * | 5/2002 | Lichtenberger .......... 228/173.1 |
| 6,600,229 | B2 | * | 7/2003 | Mukherjee et al. ......... 257/762 |
| 6,617,517 | B2 | * | 9/2003 | Hill et al. ................... 174/252 |
| 6,706,561 | B2 | * | 3/2004 | Abbott ....................... 438/123 |
| 6,761,928 | B2 | * | 7/2004 | Hill et al. ................... 427/123 |
| 2002/0175403 | A1 | * | 11/2002 | Sreeram et al. ............. 257/702 |
| 2003/0007329 | A1 | * | 1/2003 | Hill ............................ 361/704 |

FOREIGN PATENT DOCUMENTS

JP 60-100456 * 6/1985

* cited by examiner

Primary Examiner—John J. Zimmerman
(74) Attorney, Agent, or Firm—Anderson Kill & Olick, PC

(57) ABSTRACT

A multi-layer thermal interface structure for placement between a microelectronic component package and a heat sink so that the structure has a total thermal resistance of no greater than about 0.03° C.-in$^2$/W. The structure comprises a plurality of superimposed metallic layers including a core layer of a solid metal or metal alloy of high thermal conductivity preferably composed of aluminum or copper, a second layer having phase change properties and a third layer of nickel separating the solid metal layer from the layer having phase change properties.

9 Claims, 4 Drawing Sheets

THERMAL INTERFACE STRUCTURE FOR PLACEMENT BETWEEN A MICROELECTRONIC COMPONENT PACKAGE AND HEAT SINK

FIELD OF INVENTION

This is a continuation-in-part application Ser. No. 10/116,573, filed on Apr. 4, 2002, now U.S. Pat. No. 6,617,517, which in turn is a continuation-in-part of patent application Ser. No. 09/513,483, filed on Feb. 25, 2000, now U.S. Pat. No. 6,372,997.

BACKGROUND OF THE INVENTION

Microelectronic components, such as semiconductors, generate substantial heat which must be removed to maintain the component's junction temperature within safe operating limits. Exceeding these limits can change the performance characteristics of the component and/or damage the component. The heat removal process involves heat conduction through an interface material from the microelectronic component to a heat sink. The selection of the interface material and the thermal resistance of the interface between the heat generating component (e.g. silicon chip) and the heat sink controls the degree of heat transfer. As the demand for more powerful microelectronics increase so does the need for improved heat removal.

The thermal resistance between the microelectronic component package and the heat sink is dependent not only upon the intrinsic thermal resistance of the interface material but also upon the contact interface thermal resistance formed at the junction between the interface material on each opposite side thereof and the microelectronic component and heat sink respectively. One known way to minimize contact thermal resistance at each interface junction is to apply high pressure to mate the interface material to the microelectronic package and heat sink. However, excessive pressure can create detrimental and undesirable stresses. Accordingly, the application of pressure is generally limited so as not to exceed 100 psi and preferably below about 20 psi.

It is also known to use a thermal grease or paste as the thermal interface material or to use a thin sheet composed of a filled polymer, metallic alloy or other material composition having phase change properties. A material having phase change properties is characterized as having a viscosity responsive to temperature with the material being solid at room temperature and softening to a creamy or liquid consistency as the temperature rises above room temperature. Accordingly, as the microelectronic component heats up, the material softens allowing it to flow to fill voids or microscopic irregularities on the contact surface of the microelectronic component and/or heat sink. This allows the opposing surfaces between the microelectronic component and heat sink to physically come closer together as the phase change material melts thereby reducing the thermal resistance between them.

Since the microelectronic package and heat sink do not generally have smooth and planar surfaces, a relatively wide and irregular gap may form between the surfaces of the microelectronic component and heat sink. This gap can vary in size from less than 2 mils up to 20 mils or greater. Accordingly, the interface material must be of adequate thickness to fill the gap. The use of thermal grease, paste or phase change materials cannot presently accommodate large variations in gap sizes. In general as the thickness of the interface material increases so does its thermal resistance. It is now a preferred or targeted requirement for a thermal interface material to have a total thermal resistance, inclusive of interfacial contact thermal resistance, in a range not exceeding about 0.03° C.-in 2/W. Heretofore thermal interface materials did not exist which would satisfy this targeted criteria.

SUMMARY OF THE INVENTION

A multi-layer solid structure and method has been discovered in accordance with the present invention for forming a thermal interface between a microelectronic component package and a heat sink possessing low contact interfacial thermal resistance without requiring the application of high clamping pressure. Moreover, the multi-layer structure of the present invention has thermal resistance properties which do not vary widely over a gap size range of between 2–20 mils.

The multi-layer structure of the present invention is solid at room temperature and comprises a structure having at least two superimposed metallic layers, each of high thermal conductivity with one of the two layers having phase change properties for establishing low thermal resistance at the interface junction between a microelectronic component package and a heat sink and with the thickness of the layer having phase change properties being less than about 2 mils. High thermal conductivity for purposes of the present invention shall mean a thermal conductivity of above at least 10 W/m-K. The preferred class of high thermal conductivity metal carrier layers should be selected from the transition elements of row 4 in the periodic table in addition to magnesium and aluminum from row 3 and alloys thereof.

The preferred multi-layer structure of the present invention comprises at least three layers living an intermediate solid core of a high thermal conductivity metal or metal alloy and a layer on each opposite side thereof composed of a metallic material having phase change properties. A metallic material having phase change properties shall mean for purposes of the present invention a low melting metal or metal alloy composition having a melting temperature between 40° C. and 160° C. The preferred low melting metal alloys of the present invention should be selected from the group of elements consisting of indium, bismuth, tin, lead, cadmium, gallium, zinc, silver and combinations thereof. An optimum low melting alloy composition of the present invention comprises at least between 19 wt %–70 wt % indium and 30 wt %–50 wt % bismuth with the remainder, if any, selected from the above identified group of elements.

Another embodiment of the multi-layer structure of the present invention comprises a structure with at least one solid metallic layer of high thermal conductivity and a second layer having phase change properties for establishing low thermal resistance at the interface junction between a microelectronic component package and a heat sink, with said second layer superimposed on a surface of said solid metallic layer such that a border of said solid metallic layer is exposed substantially surrounding said second layer. A preferred three layer structure includes an intermediate solid metallic core with two opposing low melting alloy layers on opposite sides with each low melting alloy layer superimposed on a given surface area on each opposite side of said solid metallic core so as to form an exposed border of said solid core extending substantially about said low melting alloy.

A preferred method of the present invention for forming a thermal interface material comprises the steps of: forming a sheet of a high thermal conductivity material of predetermined geometry and thickness, treating at least one of said surfaces to form a treated surface adapted to adhere to a low melting alloy and laminating a layer of a low melting alloy upon said treated surface with the low melting alloy having a thickness of no greater than about 2 mils. The preferred method of treating the surfaces of the high thermal conductivity material to promote adhesion to a low melting alloy layer includes the step of forming dendrites on said high conductivity material which promotes adherence to the low melting alloy during lamination. Another preferred method of the present invention for forming a thermal interface material comprises the steps of: forming a sheet of high thermal conductivity material of predetermined geometry and thickness with the sheet having two opposite surfaces, treating at least one of said opposite surfaces with an organic acid flux adapted to form a treated surface to which a low melting alloy will adhere when coated thereupon, and submersing said sheet into a molten composition of a low melting alloy to form a thin coating of said low melting alloy on said treated surface with said thin coating having a thickness between 0.1 mil and 3 mils.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE DRAWINGS

Figure 1:
FIG. 1 is a cross sectional view of a solid two layer thermal interface material in accordance with the present invention with one layer having phase change properties.
Figure 2:
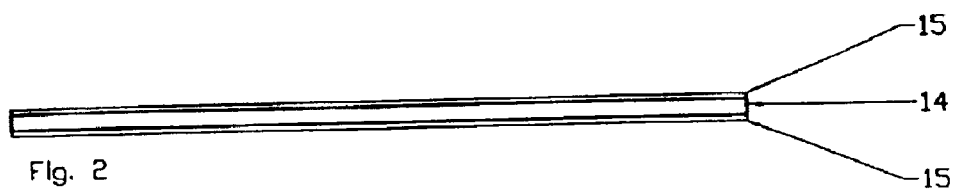
FIG. 2 is a cross sectional view of a solid three layer thermal interface material in accordance with the present invention having two opposing layers with phase change properties on opposite sides of a metallic core.
Figure 3:
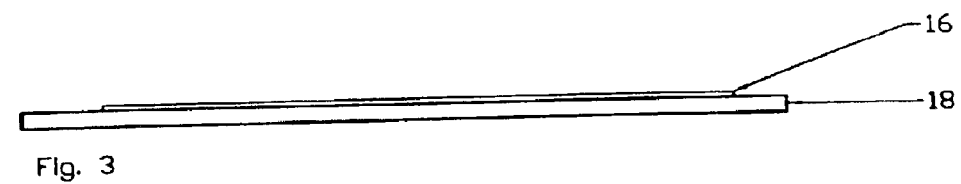
FIG. 3 is a cross sectional view of an alternate embodiment of the two layer solid structure of the present invention.
Figure 4:
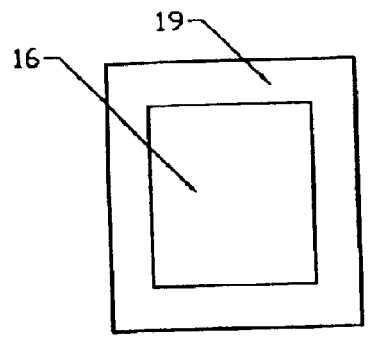
FIG. 4 is a top view of embodiment of FIG. 3.
Figure 5:
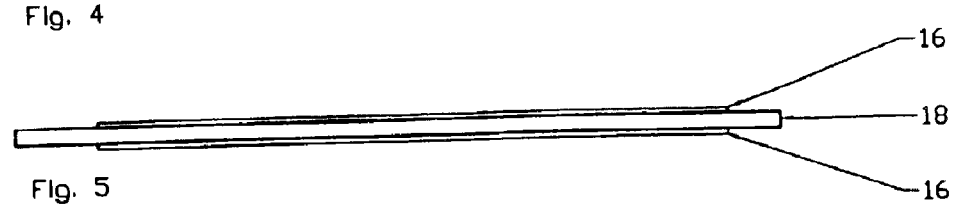
FIG. 5 is a cross sectional view of an alternate embodiment of the three layer structure of the present invention.

The thermal interface multi-layer structure of the present invention 10 is solid at room temperature and comprises at least two metallic layers. The preferred arrangement of the two layer metallic structure of the present invention is shown in cross section in FIG. 1 and consists of a solid metal or metal alloy sheet 12 of high thermal conductivity, designated a carrier layer, and a superimposed low melting alloy sheet 13 possessing phase change properties. The preferred three layer arrangement of the present invention is shown in cross section in FIG. 2 consisting of an intermediate carrier layer 14 equivalent in composition to the carrier layer 12 of FIG. 1 and two opposing layers 15 of a low melting alloy equivalent in composition to the low melting alloy layer 13. In the embodiment of FIGS. 1 and 2 each low melting alloy layer 13 or 15 is laminated over the entire planar surface of the high thermal conductivity layered sheets 12 and 14 respectively. In an alternate embodiment of the present invention as shown in FIGS. 3–5 a low melting alloy layer 16, which may or may not be equivalent in composition to the low melting alloy layers 13 and 15 of FIGS. 1 and 2, is laminated over a sheet of a metallic high thermal conductivity material 18, equivalent in composition to the layers of high thermal conductivity 12 and 14 of FIGS. 1 and 2, so as to cover only part of the planar surface of the sheet of high thermal conductivity material 18 thereby forming a border 19 which exposes a given surface area of the high thermal conductivity material layer 18. This can be accomplished by masking an area on the high thermal conductivity material layer 18 before the low melting layer is coated thereon. Alternatively, a low melting alloy metal foil of desired geometry can be laminated to a larger size foil sheet of a high conductivity material to form the border 19. It is preferred that the border 19 fully surround the pattern or footprint formed by the coating of low melting alloy material 16 although the geometry of the border 19 and the geometry of the coating of low melting alloy 16 are not essential to the present invention. Accordingly, the border 19 although shown in a rectangular geometry may be circular or of irregular geometry.

In practical applications the multilayer structure 10 is placed between a heat source (not shown) representing, for example, a microelectronic package having one or more integrated circuit chips and a heat sink (not shown) and may be compressed at any pressure up to 500 psi but preferably at a pressure below 100 psi to form a thermal interface. Under heat and temperature generated by the microelectronic heat source the low melting metal alloy melts and flows to fill up any voids or surface irregularities existing on the interface surfaces of the heat source and heat sink respectively. The alternative embodiments of FIGS. 3–5 allow for the spread of the low melting alloy 16 over the exposed surface area of the border 19 thereby preventing the escape of excess molten metal alloy from the interface junction. In fact the surface area of the border 19 to be formed can be calculated in advance for a given amount of low melting alloy 16 so that essentially no excess metal will be available to squeeze or drip out from the interface junction. In the arrangement of FIGS. 1 and 2 the low melting alloy layers must be very thin and preferably of less an 2 mils in thickness to minimize the amount of excess metal which may otherwise squeeze or drip out form the interface junction.

The effectiveness of a thermal interface material measured in terms of its overall or total thermal resistance. The units of thermal resistance are in ° C.in2/W. It has been found in accordance with the present invention that the low melting alloy layers can be of minimal thickness with the center or core material of the multi-layer structure varied in thickness to accommodate different size gaps and with the thermal resistance of the multi-layer structure maintained below about 0.03° C.-in$^2$/W at a clamping pressure of less than about 100 psi independent of gap size. To satisfy current microelectronic needs, as explained earlier, the total thermal resistance for the thermal interface material inclusive of its interfacial contact thermal resistance should not exceed about 0.03° C.-in$^2$/W at a compression or clamping pressure of less than about 100 psi. Higher thermal resistance equates to poorer performance and is unacceptable.

The following table A lists the thermal resistance of commercially available aluminum and copper foil at a thickness of 2 mils conducted under modified ASTM D5470 standard at 45 watts and 20 psi.

TABLE A

| Foil | Thickness (mils) | Thermal Resistance (° C. in$^2$/W) |
| --- | --- | --- |
| Aluminum | 2.0 | 0.129 |
| Copper | 1.8 | 0.159 |

Table B, as shown below, lists the thermal resistance of several different low melting alloy foil compositions under the same ASTM standard as that of Table A at 45 watts and 20 psi. The composition of low melting alloy 162 is: 66.3 wt % In and 33.7% wt Bi. The composition of low melting alloy 19 is: 51 wt % In, 32.5 wt % Bi and 16.5 wt % Sn whereas the composition of low melting alloy 117 is: 44.7 wt % Bi, 22.8 wt % PB, 19.1 wt % In, 8.3 wt % Sn and 5.3 wt % Cd.

TABLE B

| Low Melting Alloy | Foil Thickness (mils) | Thermal Resistance (° C. in$^2$/W) |
| --- | --- | --- |
| 19 | 2.0 | 0.010 |
| 162 | 2.0 | 0.009 |
| 117 | 2.0 | |

A thin film of a low melting metallic alloy having phase change properties may be laminated to a solid carrier of a metallic high thermal conductivity material to form the multi-layer structure of the present invention. Any metallic high thermal conductivity material may be used having a thermal conductivity of above at least 10 W/m-K inclusive of any of the transition elements of row 4 in the periodic table in addition to magnesium and aluminum of row 3 and their alloys. However, a foil sheet of either aluminum or copper as the carrier layer is preferred.

In accordance with the present invention to laminate or coat a thin layer of a low melting metallic alloy of less than about 2 mils in thickness to a foil sheet copper or alumimum requires treating the surface or surfaces of the sheet of copper or alumimum to be coated to promote the adhesion of the low melting metallic alloy. Otherwise the thin surface layers of the low melting alloy readily delaminate i.e., physically separate from each other. In fact a thin layer of a low melting metallic alloy cannot be swaged to a sheet of untreated copper or aluminum foil even at very high pressures without causing delamination. However, if the surfaces of the copper or aluminum foil to be laminated are treated in accordance with the present invention a thin layer of a low melting metallic alloy of less than 2 mils in thickness can be readily laminated or coated upon the copper or aluminum foil to form the integrated solid multi-layer structure of the present invention. The treatment may include forming dendrites on the surface of the metal foil to be laminated or by application of an organic acid flux to the surface of the metal foil to be coated. The dendrites form protrusions that form an interlocking structure with the low melting alloy during lamination. Treating a metal surface to form dendrites on the surface or treating a metal surface with an organic acid flux are known techniques but not for the purpose of assembling a multi-layer thermal interface structure as taught in the present invention.

For example, it is known that a copper surface can be treated to form a controlled surface topography of dendrites by electrochemical etching with an oxide or zinc or brass for forming dendritic sites. Fluxing a metal surface by application of an organic acid flux is also well known to improve the solderability of the surface. An organic acid flux is known to contain an organic acid preferably glutamic acid hydrochloride and polyethylene glycol or a polyglycol surfactant and may include a halide containing salt and amines as well as glycerine.

The following are examples of the multi-layer thermal interface structure of the present invention.

EXAMPLE 1

One and two ounce copper foil treated on both sides to form dendrites was used to make a three layered sandwich structure formed of alloy 162-copper-alloy 162. The three layers were swaged together. Samples were die cut, with no delamination, and with thermal resistance measured as shown below resulting in very low thermal resistance with essentially no difference between one ounce and two ounce foil carriers. The thickness of each 162 alloy layer was 2 mils.

TABLE C

| Sample/ type | Carrier thickness (mils) | Pressure (psi) | Thermal Resistance (° C. in$^2$/W) |
| --- | --- | --- | --- |
| 162/1 oz Cu/162 | 1.4 | 20 | 0.011 |
| 162/1 oz Cu/162 | 2.8 | 20 | 0.012 |

EXAMPLE 11

A multi-layer composite with a carrier layer material of copper and a layer of a low melting indium alloy on opposite sides thereof was tested with the thickness of the carrier layer varied as shown below in Table D:

TABLE D

| Core/ material | alloy foil | Core/Thickness (mils) | pressure (psi) | Thermal Resistance (° C. in$^2$/W) |
| --- | --- | --- | --- | --- |
| 1 oz Copper | None | 1.4 | 20 | 0.283 |
| 1 oz Copper | 162 | 1.4 | 20 | 0.010 |
| 2 oz Copper | 162 | 2.8 | 20 | 0.011 |
| 3 oz Copper | 162 | 4.2 | 20 | 0.011 |
| 4 oz Copper | 162 | 5.6 | 20 | 0.012 |
| 6 oz Copper | 162 | 8.4 | 20 | 0.019 |

The tests in the above table D were conducted to show that differences in thickness of the core material do not materially change the thermal resistance of the sandwich multi-layer structure. The thermal resistance is due more to the interface resistance between component and composite than to the inherent thermal resistance due to thickness changes in the core material. This is because copper has a thermal conductivity of about 300 W/mK, and therefore does not contribute significantly to the thermal resistance.

EXAMPLE 111

A similar test was conducted using aluminum as the core material with the results shown below in Table E:

TABLE E

| Carrier/ material | Alloy | Carrier/Thickness (mils) | Pressure (psi) | Thermal Resistance (° C. in$^2$/W) |
| --- | --- | --- | --- | --- |
| Aluminum | 162 | 2.00 | 20 | 0.01 |
| Aluminum | 162 | 86.5 | 20 | 0.029 |
| Aluminum | 162 | 250 | 20 | 0.063 |

The tests in the above table E clearly show that differences in thickness of the aluminum do not materially change the thermal resistance of the sandwich multi-layer structure even for drastic changes in aluminum thickness.

Figure 6:
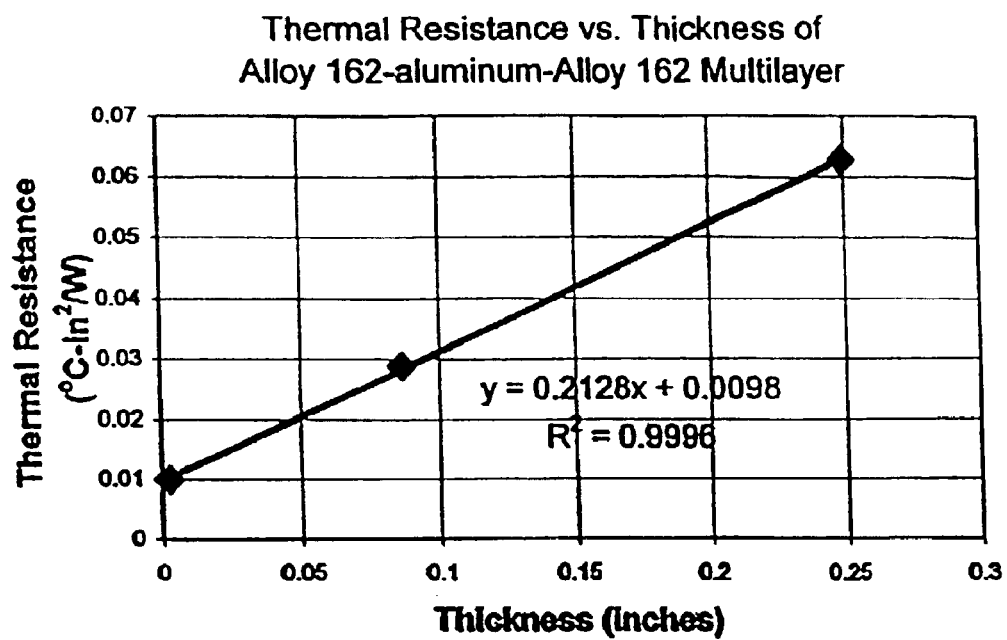
FIG. 6 is a graph showing the correlation between the resistance of the thermal interface multi-layer solid structure of the present invention and thickness.

If the thermal resistance of the three composite samples are plotted against thickness (x axis) as shown in FIG. 6 the thermal conductivity can be calculated. The thermal conductivity is the inverse of the slope of the graph and may be calculated by the following equation:

Thermal conductivity=1/slope

Thermal conductivity=1/0.2128° C. in/W·39.4 in/m=185 W/mK

The measured thermal conductivity is reasonable for aluminum.

EXAMPLE 1V

Experiments were also run on a multi-layer structure as shown below in Table F to show that the surface finish of the platens would have little effect on the thermal performance of the sandwich structure. The exact surface finish of the roughened platens is not known but the gap with no interface material, referred to as "dry gap" was measured for the roughened surfaces to compare with the normal platens polished to a surface finish of 0.4 micrometers.

TABLE F

| Sample | Platens | Carrier Thickness (mils) | Pressure (psi) | Thermal Resistance (° C. in²/W) |
|---|---|---|---|---|
| Dry gap | polished | 0 | 20 | 0.051 |
| Dry gap | roughened | 0 | 20 | 0.231 |
| 162/2 oz Cu/162 | roughened | 2.8 | 20 | 0.021 |
| 162/2 oz Cu/162 | polished | 2.8 | 20 | 0.012 |

The above table F shows that the sandwich thermal resistance is not affected greatly by differences in surface finish and tolerance issues.

EXAMPLE V

An alternative method has been discovered in accordance with the present invention for forming a thin coating of a low melting metallic alloy material with a thickness of below 1 mil on a sheet of high thermal conductivity metal following the treatment of the surface(s) to be coated to promote adhesion as explained heretofore by coating the treated surfaces with the low melting metal alloy composition by means of any conventional coating technique. An example of this alternative method follows involving submerging the sheet of high thermal conductivity metal into a molten bath of low melting metallic alloy.

3.5 pounds of a low melting alloy comprised of indium, bismuth and tin was placed into an 8 inch square pyrex dish and brought to a temperature of 95° C. in a forced air oven. The sample was prepared from 2 ounce rolled annealed double treated copper foil (i.e., treated on both sides to form a dendritic surface) and also treated on both sides thereof with an organic acid flux preferably including glutamic acid hydrochloride and polyethlyene glycol. The preferred organic acid flux as above identified is commercially available from the Superior Flux Manufacturing Company. The oven door was opened and the foil submerged into a molten bath of the low melting molten alloy for 30 seconds. The foil was pulled out of the molten alloy and excess alloy allowed to flow back into the bath. After the molten alloy was allowed to resolidify, a hot air gun was used to reflow the alloy and blow off excess until a uniform coating of 0.0005 inches was formed on both sides. The thermal resistance was measured to be 0.01° C. in²/W.

The above procedure may also be used to form a configuration as shown in FIGS. 3–5 by masking a sheet of foil of the high thermal conductivity metal using, for example, Kapton Tape, to mask the border on the treated surface(s) of the sheet of metal before submerging the sheet into the low melting molten metal alloy composition. The foil is then taken out in the same way and the tape removed leaving an uncoated border. Alternatively, an organic acid flux can be applied to specific locations on the foil surface prior to dipping causing the low melting alloy to adhere only to the surface areas treated with the organic acid flux.

Figure 7A:
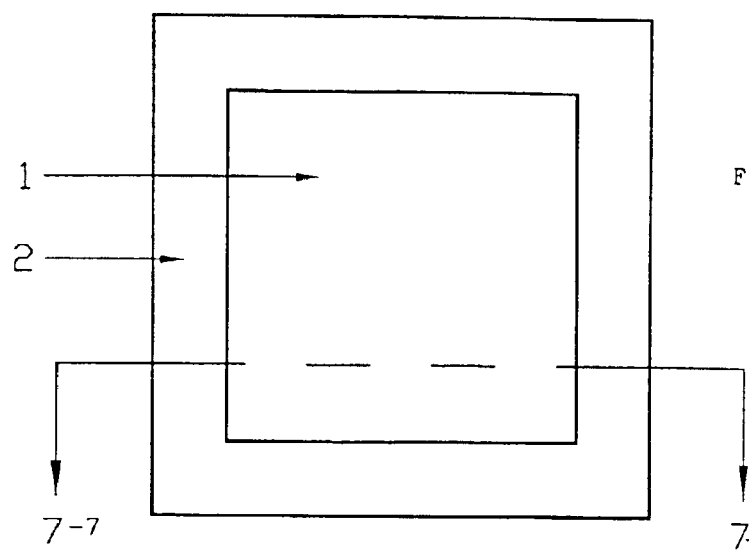
FIG. 7(a) is a schematic plan view of another embodiment showing the microelectronics package and/or heat sink with the thermal interface multi-layer solid structure extending therefrom.
Figure 7B:
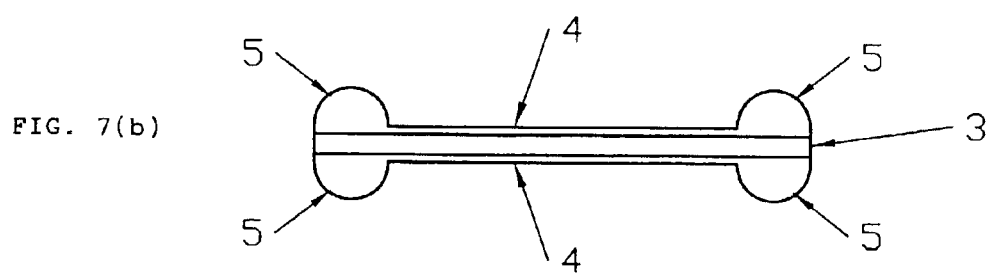
FIG. 7(b) is a cross section of FIG. 7(a) taken along the lines 7—7.

In another embodiment of the present invention as shown in FIGS. 7a and 7b the free standing thermal interface multi-layer structure 10 of the present invention is constructed of a size so that its surface area is larger than the surface area 1 of the microelectronics package and/or heat sink. This is illustrated in FIG. 7a wherein the free standing thermal interface multi-layer structure 10 is of a size so that its surface area extends from the microelectronics package and/or heat sink 1 to form an exposed border area 2.

The exposed border area 2 as is shown in FIG. 7a is deliberately exaggerated for purposes of illustration and need only be in a range of between 1 to 10 mm but preferably between 2–5 mm. The purpose of the exposed border 2 is to provide an area surrounding the microelectronics package and/or heat sink 1 which will act as a wetting surface to entrap the low melting alloy having phase change properties which is squeezed out from the multi-layer structure 10 once the phase change material softens or melts in response to an elevation in temperature at the thermal interface. The melted or softened phase change alloy material will exit from between the microelectronics package and the heat sink and make contact with the exposed border area 2 causing it to solidify in the form of a bead 5 on the border area 2. The bead 5 formed from the solidification of the low melting phase change alloy material is shown in FIG. 7b as a beaded mass surrounding the microelectronics package and/or heat sink. If no border area existed, the low melting phase change alloy material upon being squeezed out from between the microelectronics package and heat sink would freely migrate from the microelectronics package to other electronic parts resulting in possible electrical shorts which can be catastrophic to the viability of the microelectronic package.

Figure 8A:
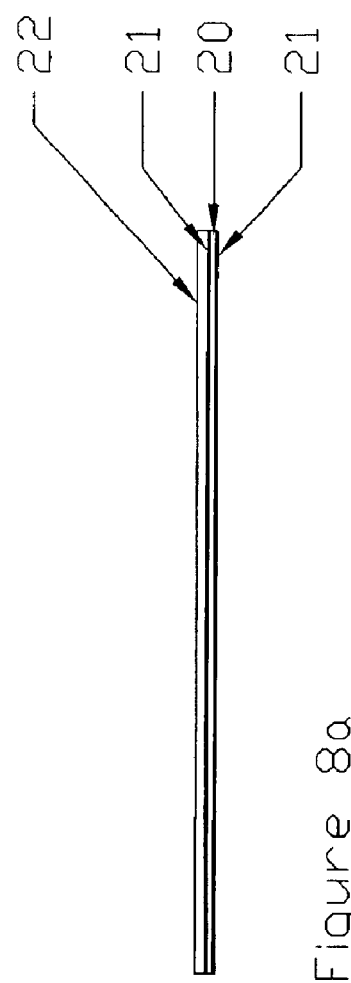
FIG. 8(a) is a cross sectional view of yet another embodiment of the present invention in an arrangement corresponding to FIG. 1.
Figure 8B:
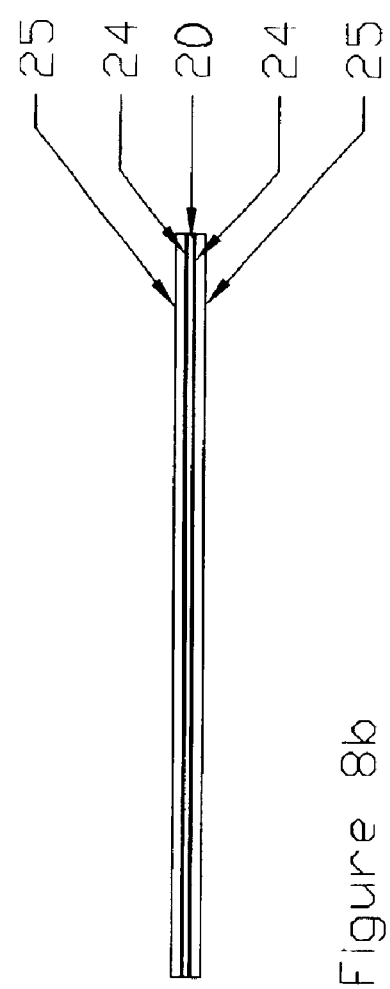
FIG. 8(b) is a cross sectional view of the embodiment of FIG. 8(a) in an arrangement corresponding to FIG. 2.

Another embodiment of the present invention is illustrated in FIGS. 8(a) and 8(b) respectively. In FIGS. 8(a) and 8(b), a solid metal carrier layer or core 20 is shown coated with a material 21 composed preferably of nickel or a nickel alloy. As an alternative, platinum may be used for the coating 21 in place of nickel. The solid metal core 20 in FIGS. 8(a) and 8(b) is equivalent to either one of the high thermal conductive metal layers 12 or 14 shown in FIGS. 1 and 2 respectively and/or to the high thermally conductive material layer 18 of FIGS. 3 and 5 respectively. In each case, the high thermally conductive material may be composed of any high thermally conductive metal or metal alloy as discussed heretofore and is preferably composed of either copper or aluminum as disclosed in Table A. Although it is preferred to coat the solid metal core 20 with a layer 21 of nickel it should be understood that the composition of the core may, itself, be nickel in which case a nickel coating is unnecessary.

A low melting alloy layer 22 is laminated to the nickel coated (21) base core 20. Any low melting alloy layer composition having phase change properties as taught in the specification in connection with the embodiments of FIGS. 1–7 may be used, preferably indium or an alloy of indium.

The nickel coating 21 should be thinner than the thickness of the core 20 and should preferably be only 1–2 micrometers in thickness. The core 20 may be coated on all sides with nickel 21 so as to fully enclose the core 20 forming a protective jacket of nickel or nickel alloy 24 as shown in FIG. 8(b). Likewise, the nickel coating 24 is enclosed by a coating 25 of a low melting alloy equivalent to the composition of the low melting alloy layer 22 of FIG. 8(a). The present invention is also applicable to the alternate arrangements shown in FIGS. 3–5 and 7 respectively, by simply substituting the nickel coated metal foil 20 for the metal foil layer taught in the respective arrangements.

The nickel coating 21 or 24 functions to prevent any of the constituents of the low melting alloy 22 or 25 from diffusing into the solid metal or metal alloy core 20. When the core 20 is composed of copper and the low melting alloy 22 or 25 comprises indium, the diffusion of indium into copper is particularly problematic in that indium is likely to penetrate into the low melting alloy to form detrimental intermetallics. In this case the nickel coating 21 or 24 acts as a diffusion barrier for the low melting alloy 22 or 25.

The preferred method for forming a multi-layered solid structure in accordance with the present invention is to first coat the core layer 20 with a layer of nickel 22 and then to immerse the nickel coated foil into a bath of a low melting alloy composition to form a low melting alloy layer 22 or 25 of preferably between 0.001–0.002 inches in thickness on both sides of the nickel coated foil. If the core layer 20 is composed of nickel it may be directly immersed into the bath.

What is claimed is:

1. A multi-layer interface structure disposed between a microelectronic component package and a heat sink so as to provide a total thermal resistance of no greater than about 0.03° C.-in$^2$/W comprising a plurality of metallic layers superimposed upon one another including at least; a first layer forming the core of the structure composed of a high thermally conductive solid metal, a thin second layer having a thickness no greater than 2 mils overlying at least one side of the core layer to form a protective coating with the second layer composed of a material selected from the group consisting of nickle or platinum or alloys thereof and a third low melting metallic material layer of a composition having phase change properties with the third layer forming a coating over the first and the second layer whereby a low thermal resistance is established at the interface junction between the microelectronic component package and the heat sink.

2. A multi-layer thermal interface structure as defined in claim 1 wherein said second layer is composed of nickel and fully encloses said first layer.

3. A multi-layer thermal interface structure as defined in claim 2 wherein said third layer having phase change properties surrounds said nickel layer.

4. A multi-layer thermal interface structure as defined in claim 3 wherein said third layer having phase change properties has a thicknes of less than about 2 mils.

5. A multi-layer thermal interface structure as defined in claim 4 wherein said third layer has a thickness of between one and two mils.

6. A multi-layer thermal interface structure as defined in claim 4 wherein said second layer has a thickness of between one and two mils.

7. A multi-layer thermal interface structure as defined in claim 6 wherein the composition of said first layer is selected from the transition elements of row 4 in the periodic table in addition to magnesium and aluminum from row 3 of the periodic table and alloys thereof.

8. A multi-layer interface structure disposed between a microelectronic component package and a heat sink so as to provide a total thermal resistance of no greater than about 0.03° C.-in$^2$/W comprising a plurality of metallic layers superimposed upon one another having, in combination, a first layer forming the core of the structure composed of a high thermally conductive solid metal having opposite sides, a second layer selected from the group consisting of nickel or platinum or alloys thereof disposed on both opposite sides of the first layer and an outer coating of a metallic material composition having phase change properties overlying both sides of said second layer whereby a low thermal resistance is established at the interface junction between the microelectronic component package and the heat sink.

9. A method for reducing the total thermal resistance between a microelectronic component package and a heat sink to no greater than about 0.03° C.-in$^2$/W comprising the steps of interposing a multi-layer interface structure between the microelectronic component package and heat sink having a highly conductive solid metal core with opposite sides, a protective layer of very low thickness on both opposite sides selected from the group consisting of nickel or platinum or alloys thereof and an outer coating overlying both opposite sides of the protective layer of a metallic material composition having phase change properties.

* * * * *